US009196664B2

(12) United States Patent
Kim et al.

(10) Patent No.: US 9,196,664 B2
(45) Date of Patent: Nov. 24, 2015

(54) DISPLAY DEVICE AND METHOD FOR FABRICATING THE SAME

(71) Applicant: Samsung Display Co., Ltd., Yongin, Gyeonggi-Do (KR)

(72) Inventors: Jong Yun Kim, Yongin-si (KR); Young Dae Kim, Yongin-si (KR); Moon Won Chang, Yongin-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/955,857

(22) Filed: Jul. 31, 2013

(65) Prior Publication Data

US 2014/0166999 A1 Jun. 19, 2014

(30) Foreign Application Priority Data

Dec. 18, 2012 (KR) ........................ 10-2012-0148831

(51) Int. Cl.
*H01L 27/14* (2006.01)
*H01L 27/32* (2006.01)

(52) U.S. Cl.
CPC .................................. *H01L 27/3258* (2013.01)

(58) Field of Classification Search
CPC ... H01L 27/32–27/326; H01L 51/50–51/5287; H01L 2227/32–2227/326; H01L 2251/5323–2251/5361; H01L 2924/12044
See application file for complete search history.

(56) References Cited

U.S. PATENT DOCUMENTS

| 2006/0113900 | A1* | 6/2006 | Oh ................................. 313/504 |
| 2009/0026927 | A1* | 1/2009 | Choi et al. ..................... 313/504 |
| 2011/0227100 | A1* | 9/2011 | Kurihara et al. ................ 257/88 |
| 2012/0104399 | A1* | 5/2012 | Choi et al. ....................... 257/59 |

FOREIGN PATENT DOCUMENTS

| KR | 10-2005-0000491 (A) | 1/2005 |
| KR | 10-2006-0067049 (A) | 6/2006 |
| KR | 10-2010-0000407 (A) | 1/2010 |
| KR | 10-1108167 (B1) | 1/2012 |

* cited by examiner

*Primary Examiner* — David Vu
*Assistant Examiner* — Cuong Nguyen
(74) *Attorney, Agent, or Firm* — Knobbe Martens Olson & Bear LLP

(57) ABSTRACT

In some aspects, a display device comprising a substrate, an organic film positioned on the substrate, an inorganic film positioned on the organic film and having at least one hole for exposing at least a part of the organic film, a first electrode positioned on the inorganic film, a second electrode positioned on the first electrode, an emission layer positioned between the first electrode and the second electrode to emit light by the first electrode and the second electrode, and an organic pattern positioned on the organic film that is exposed by the hole is provided.

11 Claims, 19 Drawing Sheets

DISPLAY DEVICE AND METHOD FOR FABRICATING THE SAME

INCORPORATION BY REFERENCE TO RELATED APPLICATIONS

Any and all priority claims identified in the Application Data Sheet, or any correction thereto, are hereby incorporated by reference under 37 CFR 1.57. For example, this application claims priority to and the benefit of Korean Patent Application No. 10-2012-0148831 filed on Dec. 18, 2012 in the Korean Intellectual Property Office, the disclosure of which is incorporated herein in its entirety by reference.

BACKGROUND

1. Field

The present disclosure relates to a display device and a method for fabricating the same.

2. Description of the Related Technology

Recently, development and commercialization of light thin flat panel displays (FPDs), which may substitute for cathode ray tube (CRT) displays, have been researched.

In the flat panel display field, a liquid crystal display (LCD) having lightweight and low power consumption is the most typically used display device up to the present. However, since liquid crystal displays are not a light emitting device, but is a light receiving device, it may have disadvantages of low brightness, a low contrast ratio, and a narrow viewing angle, new display devices that can overcome the above-described disadvantages have been actively pursued.

Since an organic light emitting diode display is self-luminous, it may have a superior viewing angle and contrast ratio in comparison to a liquid crystal display. Further, since an organic light emitting diode display does not require a backlight, it may have superior properties of being lightweight, thin-filming, and have low power consumption. Further, an organic light emitting diode display can be driven by low DC voltage, have a rapid response speed, and particularly, can have a low cost to manufacture.

Unlike a liquid crystal display or plasma display, a process of fabricating an organic light emitting diode display includes deposition and encapsulation processes. In particular, the deposition process is typically a process for forming various structures that constitute the organic light emitting diode display, and is generally performed under high-temperature conditions of about 300° C. to 400° C.

During the deposition process, under high-temperature conditions for depositing an inorganic film on an organic film in a state where the organic film is formed on a substrate in the deposition process, outgas may be generated from the organic film. The inorganic film that is formed in the deposition process under high-temperature conditions may peel off from the organic film due to outgas generation during the deposition process. This may cause thickness non-uniformity or discontinuity of the inorganic film that is formed in the deposition process deteriorating reliability of the organic light emitting diode display.

SUMMARY

Accordingly, if the deposition process is performed under the low-temperature conditions of about 180° C. to 200° C., the amount of outgas that is generated from the organic film can be reduced, and thus the peeling-off of the inorganic film that is formed in the deposition process may be reduced.

However, if the deposition process is performed under low-temperature conditions of about 180° C. to 200° C., adhesion between the inorganic film that is formed in the deposition process and the organic film that comes in contact with the inorganic film may be insubstantial, and thus the characteristics of the inorganic film that is formed in the deposition process may not reach the desired characteristics. Further, in the case of etching the inorganic film that is formed in the deposition process thereafter, non-etching or over-etching of the inorganic film may occur.

Accordingly, one subject to be addressed by the present disclosure is to provide a display device which includes an outgas discharge path to form a high-quality inorganic film on an organic film through a deposition process under high-temperature conditions.

Another subject to be addressed by the present disclosure is to provide a method for fabricating a display device which includes an outgas discharge path to form a high-quality inorganic film on an organic film through a deposition process under high-temperature conditions.

Additional advantages, subjects, and features of the embodiments will be set forth in part in the description which follows and in part will become apparent to those having ordinary skill in the art upon examination of the following or may be learned from practice of the invention.

According to an aspect of the present embodiments, there is provided a display device comprising a substrate, an organic film positioned on the substrate, an inorganic film positioned on the organic film and having at least one hole for exposing at least a part of the organic film, a first electrode positioned on the inorganic film, a second electrode positioned on the first electrode, an emission layer positioned between the first electrode and the second electrode to emit light by the first electrode and the second electrode, and an organic pattern positioned on the organic film that is exposed by the hole.

According to another aspect of the present embodiments, there is provided a display device comprising a substrate, an organic film positioned on the substrate, an inorganic film positioned on the organic film and having at least one hole for exposing at least a part of the organic film, a first electrode positioned on the inorganic film, a second electrode positioned on the first electrode, an emission layer positioned between the first electrode and the second electrode to emit light by the first electrode and the second electrode, and an insulating film positioned on the inorganic film and being in contact with the organic film that is exposed by the hole.

According to still another aspect of the present embodiments, there is provided a method for fabricating a display device comprising forming a thin film transistor on a substrate, forming an organic film on the thin film transistor, applying a photosensitive film to the organic film, forming an organic pattern of a reverse-tapered shape by selectively exposing and developing the photosensitive film, and forming an inorganic film on the organic film and the organic pattern. In some embodiments, the organic film may include one or more selected from the group consisting of acryl, polyimide and polyester. In some embodiments, the organic pattern may be a negative photoresist. In some embodiments, the inorganic film may include one or more selected from the group consisting of silicon oxide, silicon nitride, silicon oxynitride, aluminum oxide, aluminum nitride, titanium oxide and titanium nitride.

According to the embodiments of the present disclosure, at least the following effects can be achieved.

That is, since the inorganic film is prevented from peeling off from the organic layer in the inorganic film deposition process under the high-temperature conditions, the high-quality inorganic film can be formed on the organic film.

Further, since most of the out gas that remains on the organic film in the high-temperature deposition process is discharged, the influence of the out gas on surrounding structures can be minimized even after the completion of the deposition process.

Further, sufficient adhesion can be obtained between the inorganic film formed in the deposition process and the organic film that comes in contact with the inorganic film.

Further, in the case of etching the inorganic film formed in the deposition process, non-etching or over-etching of the inorganic film can be prevented.

The effects according to the present embodiments are not limited to the contents as exemplified above, but further various effects are included in the description.

BRIEF DESCRIPTION OF THE DRAWINGS

The above and other objects, features and advantages of the present embodiments will be more apparent from the following detailed description taken in conjunction with the accompanying drawings, in which.

DETAILED DESCRIPTION

Figure 1:
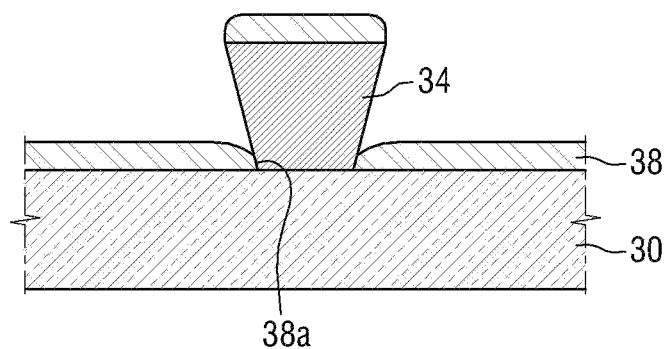
FIG. 1 is an enlarged cross-sectional view of an organic pattern of a display device according to an embodiment of the present disclosure.

Exemplary embodiments of the present disclosure will hereinafter be described in detail with reference to the accompanying drawings, in which typical embodiments are shown. However, these embodiments are only exemplary, and this disclosure is not limited thereto and may be embodied in diverse forms.

The term "on" that is used to designate that an element is on another element or located on a different layer or a layer includes both a case where an element is located directly on another element or a layer and a case where an element is located on another element via another layer or still another element. The same drawing reference numerals are used for the same elements across various figures throughout the specification.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments of the present disclosure will be described with reference to the accompanying drawings.

Figure 2:
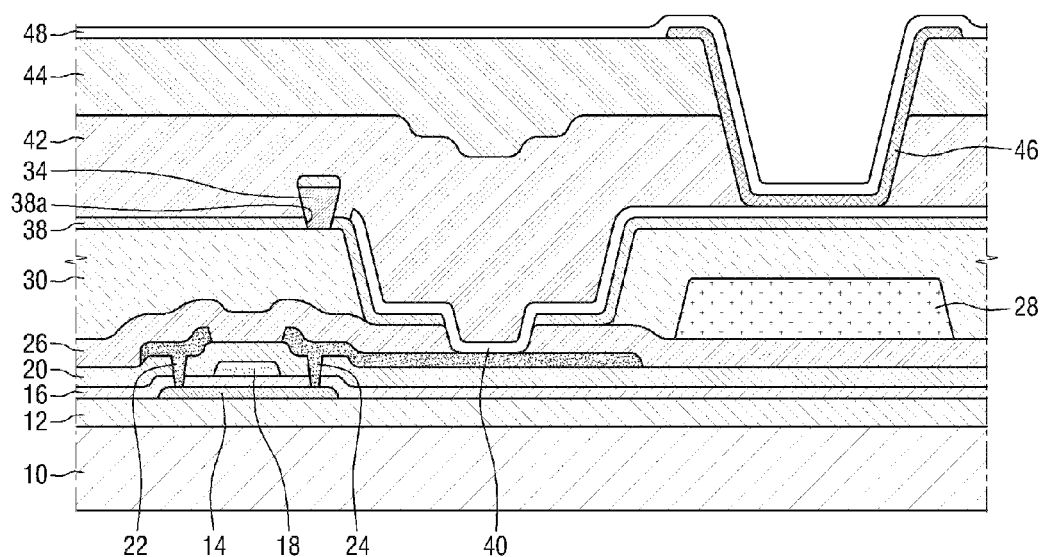
FIG. 2 is a cross-sectional view of a display device according to an embodiment.
Figure 3:
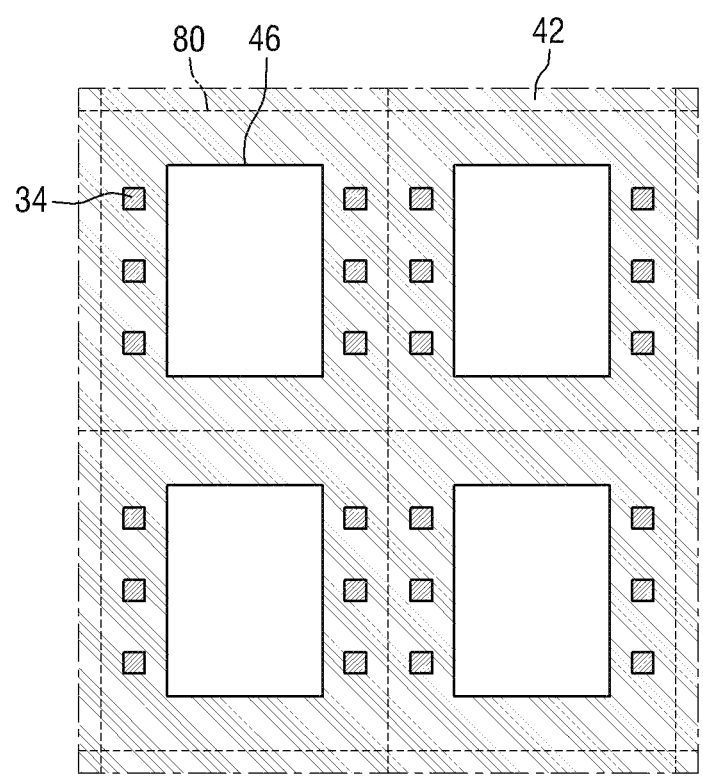
FIG. 3 is a plan view of a display device according to an embodiment.

FIG. 1 is an enlarged cross-sectional view of an organic pattern 34 of a display device according to an embodiment. FIG. 2 is a cross-sectional view of a display device according to an embodiment, and FIG. 3 is a plan view of a display device according to an embodiment.

A display device is a device that displays an image, and may be a liquid crystal display, an electrophoretic display, an organic light emitting display, an inorganic EL (Electro Luminescence) display, a field emission display, a surface-conduction electron-emitter display, a plasma display, or a cathode ray display.

Hereinafter, as the display device according to an embodiment, an organic light emitting display will be described. For example, a white organic light emitting display (white OLED (W-OLED)) among various kinds of organic light emitting displays will be described. However, the display device according to the present embodiments is not limited thereto, but various types of display devices may be used.

Referring to FIG. 2, a display device according to an embodiment may include a thin film transistor provided on a buffer layer 12 that is formed on a substrate 10.

In some embodiments, the buffer layer 12 serves to prevent infiltration of impurity elements and to planarize the surface, and may be made of various materials that serve to perform such functions of the buffer layer 12. In some embodiments, the buffer layer 12 may be formed of an inorganic material, such as silicon oxide, silicon nitride, silicon oxynitride, aluminum oxide, aluminum nitride, titanium oxide, or titanium nitride, or an organic material, such as polyimide, polyester, or acryl, or a lamination thereof. In some embodiments, the buffer layer 12 may not be included.

In some embodiments, an active layer 14 that is made of a semiconductor material may be formed as a pattern on the buffer layer 12. In some embodiments, the active layer 14 may be formed of polycrystalline silicon, but is not limited thereto, and may be formed of oxide semiconductor. In some embodiments, the active layer may be a G-I-Z-O layer $[(In_2O_3)_a(Ga_2O_3)_b(ZnO)_c$ layer] (where, a, b, and c are real numbers that satisfy the conditions of $a \geq 0$, $b \geq 0$, and $c > 0$).

In some embodiments, a gate insulating film 16 may be formed on the buffer layer 12 to cover the active layer 14, and a gate electrode 18 may be formed on the gate insulating film 16.

In some embodiments, an interlayer insulating film 20 may be formed on the gate insulating film 16 to cover the gate electrode 18, and a source electrode 22 and a drain electrode 24 may be formed on the interlayer insulating film 20 to come in contact with each other via the active layer 14 and a contact hole.

In some embodiments, at least one thin film transistor as configured above may be provided for each pixel.

In some embodiments, the thin film transistor may be covered by a first protection layer 26. In some embodiments, the first protection layer 26 may be a layered structure having at least one layer that is formed on the interlayer insulating film 20, and may be made of an organic material and/or an inorganic material. In some embodiments, the organic material may be a polymer material, such as acryl, polyimide, or polyester, and the inorganic material may be silicon oxide, silicon nitride, silicon oxynitride, aluminum oxide, aluminum nitride, titanium oxide, or titanium nitride.

In some embodiments, a color filter may be formed on the first protection layer 26, and a planarization layer 30 may be formed on the color filter 28. In some embodiments, the white organic light emitting display (OLED) may use the color filter 28 to implement red, green, and blue colors and may use the planarization layer 30 to compensate for a step height of the color filter 28. In some embodiments, the color filter 28 and the planarization layer 30 may be organic films made of an organic material. In some embodiments, a photo acryl material may be used as the planarization layer 30.

In some embodiments, the color filter 28 may be formed with a thickness of about 1 μm to 2 μm to implement the color characteristics, and the planarization layer 30 may be formed with a thickness of 2 μm to 3 μm to compensate for the step height of the color filter 28.

In some embodiments, the color filter 28 and the planarization layer 30 may generate outgas 70 in a deposition process under high-temperature conditions, and such outgas 70 may exert an influence on the emission layer 46 to cause the occurrence of pixel reduction or the like. In some embodiments, the outgas 70 may be generated due to photoreaction that occurs in a patterning process of the color filter 28 and the planarization layer 30 and mainly due to PAC (Photoactive Compound) components. As the remaining gases, benzaldeyde, benzyl alcohol, toluene that is a benzene-based compound, and xylane are observed.

In some embodiments, a second protection layer 38 may be formed on the planarization layer 30 in order to prevent the occurrence of the pixel reduction or the like. In some embodiments, the second protection layer 38 may be made of the same material as the first protection layer 26, but is not limited thereto. In some embodiments, the second protection layer 38 may be an inorganic film that is made of an inorganic material, and may be made of silicon oxide, silicon nitride, silicon oxynitride, aluminum oxide, aluminum nitride, titanium oxide, or titanium nitride.

In some embodiments, a first electrode 40 may be formed on the second protection layer 38. In some embodiments, the first electrode 40 may be connected to the drain electrode through a via-hole that is formed on the first protection layer 26 and the second protection layer 38.

In some embodiments, a pixel-defining film 42 may be formed on the second protection layer 38, and this pixel-defining film 42 may cover the edge of the first electrode 40. In some embodiments, the pixel-defining film 42 may be provided with an opening that exposes a part of the first electrode 40. In some embodiments, the pixel-defining film 42 may be formed of an organic material, such as acryl, polyimide, and polyester, but is not limited thereto. In some embodiments, the pixel-defining film 42 may also be formed of an inorganic material or an organic/inorganic composite.

In some embodiments, a spacer 44 may be formed on the pixel-defining film 42. In some embodiments, the spacer 44 may planarize the surface of the pixel-defining film 42 in the case where the surface of the pixel-defining film 42 is uneven. In some embodiments, the spacer 44 may adjust the overall thickness of the organic light emitting display.

In some embodiments, the emission layer 46 may be formed on the first electrode 40, the pixel-defining film 42, and the spacer 44 to cover a part of the first electrode 40 that is exposed through the opening, and the second electrode 48 may be formed on the emission layer 46, the pixel-defining film 42, and the spacer 44 to cover the emission layer 46.

In some embodiments, the first electrode 40 may be independently patterned so as to discriminate each pixel. In some embodiments, the second electrode 48 may be formed as a common electrode to cover all the pixels, but is not limited thereto. In some embodiments, the second electrode 48 may be independently patterned as to discriminate each pixel in the same manner as the first electrode 40.

In some embodiments, the organic light emitting display may be configured by the first electrode 40, the second electrode 48, and the emission layer 46. In some embodiments, the voltage applied to the first electrode 40 and the second electrode 48 may be adjusted by the thin film transistor.

In a preferred embodiment, the first electrode 40 and the second electrode 48 may have polarities opposite to each other. In some embodiments, the first electrode 40 and the second electrode 48 may be an anode and a cathode, respectively, or on the contrary, may be a cathode and an anode, respectively.

In any case, the electrode that acts as an anode includes a conductor of which an absolute value of the work function is large, and the electrode that acts as a cathode includes a conductor of which an absolute value of the work function is small. In some embodiments, the conductor having a large absolute value of the work function may be a transparent conductive oxide, such as, ITO, $In_2O_3$, ZnO, or IZO, or a noble metal, such as Au. In some embodiments, the conductor having a small absolute value of the work function may be Ag, Al, Mg, Li, Ca, LiF/Ca, or LiF/Al.

In embodiments of a top emission type in which an image is implemented in a direction opposite to the substrate 10, the first electrode 40 may include a light reflector, and the second electrode 48 may be light-permeable.

For this, in embodiments where the first electrode 40 acts as an anode, Ag, Mg, Al, Pt, Pd, Au, Ni, Nd, Ir, Cr, or a compound thereof, may be formed as the reflector, and ITO, IZO, ZnO, or $In_2O_3$, which has high work function, may be formed on the reflector. In the case where the first electrode 40 acts as a cathode, the first electrode 40 may be formed of Ag, Al, Mg, Li, Ca, Lif/Ca, or LiF/Al, which has low work function and is light-reflective.

In embodiments where the second electrode 48 acts as a cathode, the second electrode 48 may be formed of a metal having low work function, such as Li, Ca, Lif/Ca, LiF/Al, Al, Mg, or Ag, with a thin thickness so that the second electrode 48 becomes a semi-permeable film. In some embodiments, by forming a transparent conductor, such as ITO, IZO, ZnO, or $In_2O_3$, on such a metal semi-permeable film, a high-resistance problem due to the thin thickness can be solved. In embodiments where the second electrode 48 acts as an anode, the second electrode 48 may be formed of ITO, IZO, ZnO, or $In_2O_3$.

In some embodiments, the material for forming the first electrode 40 and the second electrode 48 may be replaced by other materials known by those skilled in the art.

In some embodiments, the first electrode and the second electrode may apply voltages having different polarities to the emission layer 46 that is interposed between the first electrode and the second electrode to make the emission layer 46 emit light.

In some embodiments, a low-molecular or high-molecular organic layer may be used as the emission layer 46. In embodiments using the low-molecular organic layer, a hole injection layer (HIL), a hole transport layer (HTL), an emission layer (EML), an electron transport layer (ETL), and an electron injection layer (EIL) may be laminated in a single or composite structure, and various usable organic materials, such as copper phthalocyanine (CuPc), (N,N'-Di(naphthalene-1-yl)-N,N'-diphenyl-benzidine: NPB), and (tris-8-hydroxyquinoline aluminum) (Alq3), may be adopted. In some embodiments, these low-molecular organic layers may be formed in vapor deposition method.

In some embodiments, the high-molecular organic layer may have a structure in which a hole transport layer (HTL) and an emission layer (EML). In this case, PEDOT may be used as the hole transport layer, and PPV (Poly-Phenylenevinylene)-based and polyfluorene-based high-molecular organic materials may be used as the emission layer. In some embodiments, the above-described layers may be formed in a screen printing method or an ink jet printing method.

In some embodiments, the emission layer 46 may be included in a unit pixel area 80. In some embodiments, the unit pixel area 80 may be an area that includes one emission layer 46. In some embodiments, at least one thin film transistor may be included in the unit pixel area 80. Referring to FIG. 3, the unit pixel area 80 may be arranged in a matrix form, but is not limited thereto. In some embodiments, the unit pixel area 80 may also be arranged in a pentile form.

In some embodiments, a plurality of emission layers 46 may be provided. In some embodiments, the plurality of emission layers 46 may be formed to be space apart from each other on substantially the same plane. Referring to FIG. 3, the plurality of emission layers 46 may be arranged in the matrix form, but is not limited thereto. In some embodiments, the plurality of emission layers 46 may also be arranged in the pentile form.

The above-described emission layers 46 are not limited to those as described above, but various examples thereof may be adopted.

In some embodiments, referring to FIGS. 1 and 2, the inorganic film, that is, the second protection layer 38, may include at least one hole 38a that exposes at least a part of the organic film, that is, the planarization layer 30. Here, exposing of at least a part of the planarization layer 30 may mean that the second protection layer 38 is not present on a partial area of the planarization layer 30 and at least a part of the planarization film 30 comes in direct contact with other layers except for the second protection layer 38. In some embodiments, the hole 38a may mean a portion where the second protection layer 38 is not present on the planarization layer 30.

In some embodiments, the thickness of the second protection layer 38 in the area that is adjacent to the hole 38a may be smaller than the thickness of the second protection layer 38 in the area that is not adjacent to the hole 38a. In an exemplary embodiment, the thickness of the second protection layer 38 is constant on the substrate 10 on the while, but the thickness of the second protection layer 38 that is adjacent to the hole 38a may be smaller than the thickness of the second protection layer 38 in other areas. In some embodiments, the shape of the hole 38a may be a rectangle as seen from the upper side of the organic light emitting display device. However, the shape of the hole 38a is not limited thereto, but may be in the shape of a circle, an ellipse, or a polygon.

In some embodiments, an organic pattern 34 may be positioned on the planarization layer 30 that is exposed by the hole 38a. In some embodiments, at least a part of the organic pattern 34 may come in direct contact with the planarization layer 30. In some embodiments, the organic pattern 34 may come in direct contact with the whole of the planarization layer 30 that is exposed by the hole 38a through filling the whole of the hole 38a, but is not limited thereto. In some embodiments, the organic pattern 34 may also come in direct contact with a part of the planarization layer 30 that is exposed by the hole 38a.

In some embodiments, as illustrated in FIGS. 1 and 2, the organic pattern 34 may be in a reverse-tapered shape. In an exemplary embodiment, if the organic pattern 34 is cut in parallel to one surface of the planarization layer 30, the cross-sectional area of the cross section of the organic pattern 34 may be reduced toward the direction of the planarization layer 30. In the cross-sectional views of FIGS. 1 and 2, the organic pattern 34 may be in a trapezoidal shape, and one of two bases of the trapezoid, which has a short length, may come in direct contact with the planarization layer 30.

In some embodiments, the second protection layer 38 may be positioned on the planarization layer 30 to come in direct contact with the planarization layer 30, and may also be positioned on the organic pattern 34 to come in direct contact with the organic pattern. In some embodiments, the second protection layer 38 may be positioned on an upper surface of the organic pattern 34. In some embodiments, the second protection layer 38 may not be positioned on a side surface of at least a part of the organic pattern 34. In some embodiments, the second protection layer 38 may be positioned only on the upper surface of the organic pattern 34. In some embodiments, the pixel-defining film 42 may come in direct contact with the side of at least a part of the organic pattern 34. FIGS. 1 and 2 illustrate embodiments where the second protection layer 38 is not positioned on the side surface of the part of the organic pattern 34. However, the present embodiments are not limited thereto, but the second protection layer may also be positioned on the side surface of the organic pattern 34. In some embodiments, the thickness of the second protection layer 38 formed on the side surface of the organic pattern 34 may be smaller than the thickness of the organic pattern 34 formed on the upper surface of the organic pattern 34.

In some embodiments, the second protection layer 38 is not positioned on the side surface of at least a part of the organic pattern 34 or the thickness of the second protection layer 38 positioned on the side surface of at least a part of the organic pattern 34 is smaller than the thickness of the second protection layer 38 positioned on the upper surface of the organic pattern 34 because the second protection layer 38 is deposited in a deposition process. In some embodiments, the second protection layer 38 positioned on the planarization layer 30 may be deposited through the deposition process. For example, an inorganic material, which is discharged from a deposition source that is opposite to the planarization layer 30, may be deposited on the planarization layer 30 to form the second protection layer 38. Here, since the moving path of the inorganic material that is discharge from the deposition source secures a rough linearity, the inorganic material may not be deposited on the side surface of the organic pattern 34 having a reversely tapered shape, or the amount of the organic pattern 34 that is deposited on the side surface of the organic pattern 34 may be smaller than the amount of the inorganic material that is deposited on the upper surface of the organic pattern 34.

In some embodiments, the organic pattern 34 may be made of an organic material. In an exemplary embodiment, the organic pattern 34 may be made of photoresist. In some embodiments, the organic pattern 34 may be made of negative photoresist. If the negative photoresist is used as the material that forms the organic pattern 34, it becomes easy to form the shape of the organic pattern 34, that is, the reversely tapered shape, and the organic pattern 34 itself may serve as the movement path of the outgas 70 as well. In some embodiments, the material that forms the organic pattern 34 may be any one of various materials which can be easily formed in the reversely tapered shape and which the outgas 70 can penetrate, or a combination thereof.

In some embodiments, the organic pattern 34 may be formed to overlap the thin film transistor. In an exemplary embodiment, the organic pattern 34 may be formed to overlap the drain electrode 24, but is not limited thereto. In some embodiments, the organic pattern 34 may also be formed to overlap the source electrode 22 or the gate electrode 18.

In some embodiments, the organic pattern 34 or the hole 38a may be positioned between the plurality of emission layers 46. In some embodiments, the plurality of emission layers 46 may be formed to be spaced apart from each other. In an exemplary embodiment as illustrated in FIG. 3, a plurality of organic patterns 34 may be formed to be adjacent to both side surfaces of the emission layers 46. In some embodiments, three organic patterns 34 may be formed in an area that is adjacent to one side surface of the emission layer 46 and three organic patterns 34 may also be formed in an area that is adjacent to the other side surface that is opposite to the one side surface of the emission layer 46 in the unit pixel area 80. In some embodiments, the plurality of organic patterns 34 may be arranged in parallel to the one side surface and the other side surface of the emission layer 46 to be spaced apart from each other by the same distance, but are not limited thereto. In an exemplary embodiment as illustrated in FIG. 3, since the emission layers 46 are arranged in a matrix form and the organic patterns 34 are formed on both side surfaces of each matrix, two columns of organic patterns 34 may be formed between the adjacent emission layers 46 in a row direction. In some embodiments, the organic pattern 34 may not be formed between the adjacent emission layers 46 in a column direction.

Figure 4:
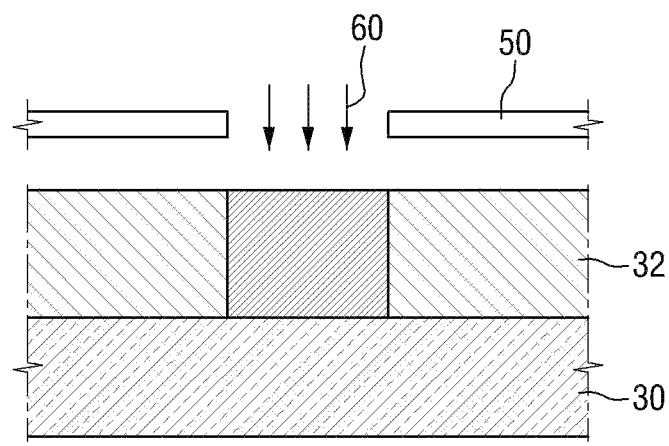
FIGS. 4 to 6 are cross-sectional views explaining a method for fabricating a display device according to an embodiment.
Figure 5:
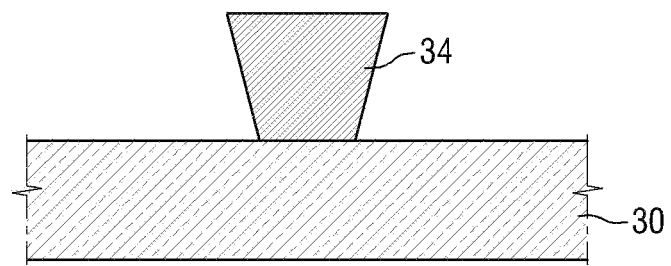
Figure 6:
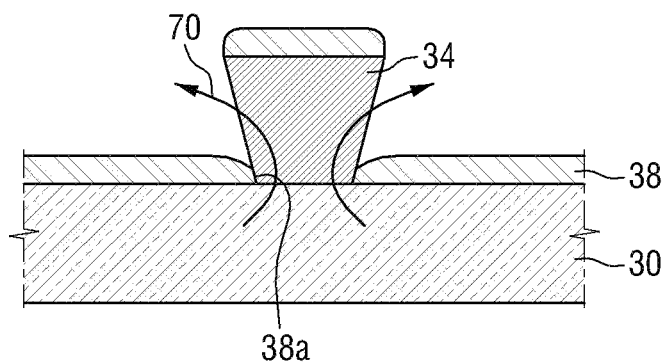

Hereinafter, a method for fabricating a display device according to an embodiment will be described with reference to FIGS. 4 to 6. FIGS. 4 to 6 are cross-sectional views explaining a method for fabricating a display device according to an embodiment. For convenience in explanation, the explanation of a portion that is duplicate to the contents of the above-described display device will be omitted.

First, referring to FIG. 4, a photosensitive film 32 may be spread on the planarization layer 30. In some embodiments, the photosensitive film 32 may be a thin film having a property that is easily changed by light, that is, having photosensitivity, and various kinds of photosensitive films 32 may be used. However, it is preferable to use the photosensitive film 32 which can be easily formed in the reversely tapered shape and which the outgas 70 can penetrate. In this embodiment, it is exemplified that the above-described negative photoresist is used as the photosensitive film 32. In some embodiments, after the photosensitive film 32 is spread on the planarization layer 30, a mask 50, which has an opening in a position where the organic pattern 34 is to be formed, may be aligned on the photosensitive film 32. In some embodiments, the position where the organic pattern 34 is to be formed may be substantially the same as the position where the hole 38a is formed. In some embodiments, the negative photoresist on the area where the organic pattern 34 is to be formed may be hardened by irradiation with ultraviolet rays 60 through the opening after the mask 50 is aligned.

Next, referring to FIG. 5, the organic pattern 34 in the reversely tapered shape may be formed by developing the negative photoresist after the irradiation with the ultraviolet rays 60. That is, if the negative photoresist is exposed and developed, a portion which is irradiated with the ultraviolet rays 60 may remain in the reversely tapered shape. As described above, when the organic pattern 34 is formed, the negative photoresist, which is used even in other processes, may be used to simplify the forming of the patterns in the reversely tapered shape and to reduce the processing cost, but is not limited thereto.

Next, referring to FIG. 6, the second protection layer 38 may be formed on the planarization layer 30 and the organic pattern 34. In some embodiments, the second protection layer 38 may be formed through a deposition process. In some embodiments, the deposition process can be performed under high-temperature conditions of 300° C. to 400° C. That is, in the deposition process under high-temperature conditions, the outgas 70 that is generated from the planarization layer 30 (or the color filter 28) is unable to pass through the second protection layer 38 that is made of an inorganic material, but is able to pass through the organic pattern 34 that is made of an organic material. If the hole 38a or the organic pattern 34 is not present, there is no path through which the outgas 70 that is generated from the planarization layer 30 (or the color filter 28) is discharged, and thus the outgas 70 may penetrate and get out of the second protection layer 38 or leak out through the edge of the second protection layer 38. That is, the second protection layer 38 may not be properly deposited on the planarization layer 30, but peel off from the planarization layer 30. However, since the display device according to an embodiment includes the hole 38a and the organic pattern 34, the outgas 70 that is generated in the high-temperature deposition process of the second protection layer 38 may be discharged through the hole 38a and the organic pattern 34, and thus the peeling-off of the second protection layer 38 can be prevented. Further, since an appropriate environment for forming the second protection layer 38 is provided, the second protection layer 38 can be formed with high quality. Further, the outgas 70 that remains in the planarization layer 30 (or the color filter 28) can be mostly discharged in the high-temperature deposition process, and the influence of the outgas 70 on the surrounding structures can be minimized even after the completion of the deposition process.

Figure 7:
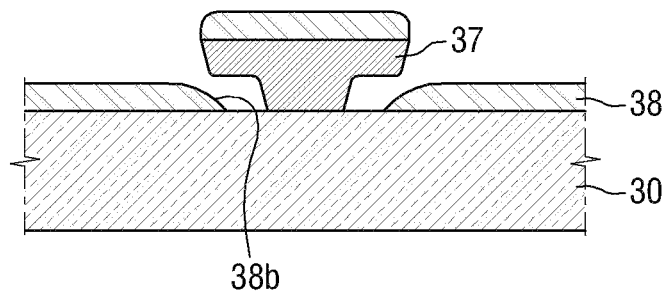
FIG. 7 is an enlarged cross-sectional view of an organic pattern of a display device according to another embodiment.

FIG. 7 is an enlarged cross-sectional view of an organic pattern 37 of a display device according to another embodiment. For convenience in explanation, the same reference numerals are used for elements which are substantially the same as the elements illustrated in FIG. 1, and the duplicate explanation thereof will be omitted.

Referring to FIG. 7, the display device according to another embodiment may include a "T"-shaped organic pattern 37. Here, the "T"-shape may be the shape shown in the cross-sectional view of FIG. 7. In some embodiments, the "T"-shaped organic pattern 37 may include a pillar portion which comes in contact with the planarization layer 30 and is formed perpendicular to one surface of the planarization layer 30, and a wing portion formed to extend for a predetermined distance from an end portion of the pillar portion in a direction that is parallel to one surface of the planarization layer 30. In some embodiments, the pillar portion may come in contact with a part of the planarization layer 30 that is exposed by a hole 38b. In an exemplary embodiment illustrated in FIG. 7, the hole 38b is illustrated to have a shape different from the shape of the hole 38a of the display device according to an embodiment, but is not limited thereto. In an exemplary embodiment, the pillar portion may be positioned in the center portion of the area that is exposed by the hole 38b. In some embodiments, the second protection layer 38 may be formed on the wing portion. In some embodiments, the second protection layer 38 may not be positioned on at least a part of the planarization layer 30 that overlaps the wing portion. In an exemplary embodiment, at least a part of the planarization layer 30 that overlaps the wing portion may come in direct contact with the pixel-defining film 42.

Hereinafter, a method for fabricating a display device according to another embodiment will be described with reference to FIGS. 8 to 11. FIGS. 8 to 11 are cross-sectional views explaining a method for fabricating a display device according to another embodiment. For convenience, the explanation of a portion that is duplicate to the contents of the above-described display device will be omitted.

Figure 8:
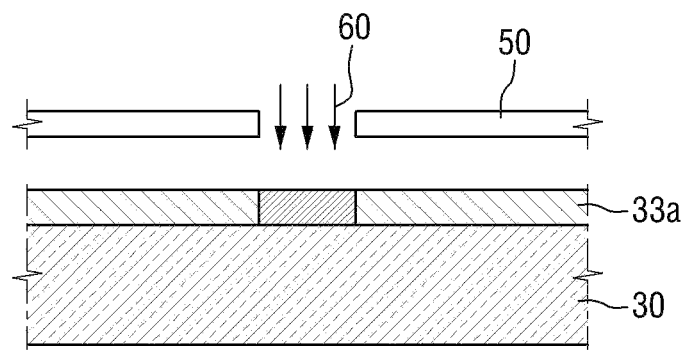
FIGS. 8 to 11 are cross-sectional views explaining a method for fabricating a display device according to another embodiment.
Figure 9:
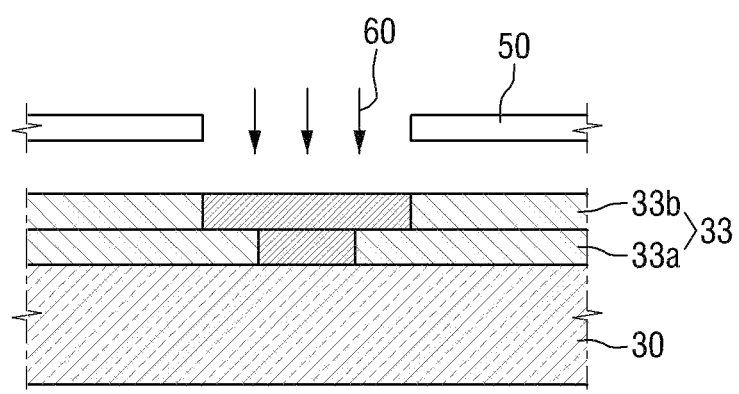

First, referring to FIGS. 8 and 9, a photosensitive film 32, for example, photoresist, may be spread on a planarization layer 30, and then may be selectively exposed. Although this step is similar to the step illustrated in FIG. 4, this step is different from the step illustrated in FIG. 4 on the point that a first photosensitive film 33a and a second photosensitive film 33b are sequentially spread and then exposed.

In some embodiments, referring to FIG. 8, the first photosensitive film 33a may be spread on the planarization film 30, and an area where a pillar portion of an organic pattern 37 is to be positioned may be selectively exposed.

Next, referring to FIG. 9, the second photosensitive film 33b may be spread on the first photosensitive film 33a, and an area where a wing portion of the organic pattern 37 is to be positioned may be selectively exposed.

Figure 10:
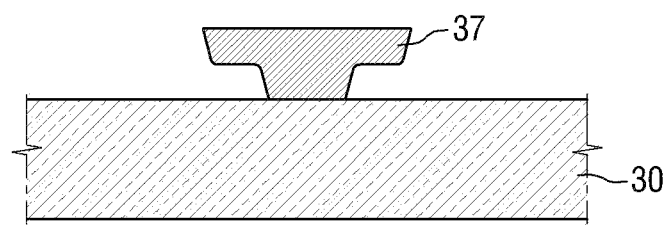

Next, referring to FIG. 10, the "T"-shaped organic pattern 37 may be formed by developing the first photosensitive film 33a and the second photosensitive film 33b. In FIGS. 8 to 10, it is demonstrated that the negative photoresist may be used as the photosensitive film 33, and thus the pillar portion and the wing portion have reversely tapered shapes, but are not limited thereto. Particularly, in the display device according to another embodiment, since the organic pattern 37 has the "T"-shape, it is difficult to deposit an inorganic material on a side surface of the "T"-shape, in particular, even on the area that is adjacent to the side surface of the pillar portion, and thus it is not necessary that the pillar portion and the wing portion are all in a reversely tapered shape. For example, even by using the positive photoresist as the first photosensitive film 33a and the second photosensitive film 33b, the second protection film can be prevented from being deposited on the side surface of the organic pattern 37, in particular, on the side surface of the pillar portion.

Figure 11:
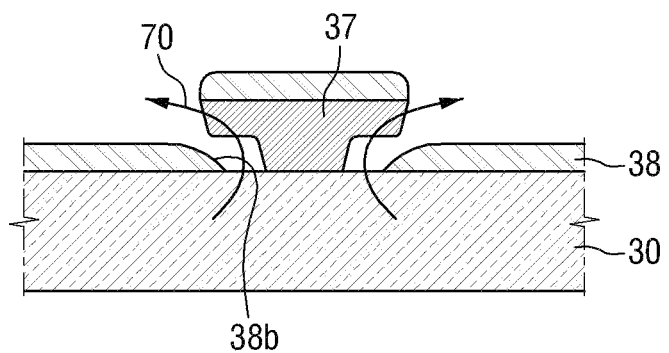

Next, referring to FIG. 11, a second protection layer 38 may be formed on the planarization layer 30 and the organic pattern 37 through a deposition process under high-temperature conditions. In some embodiments, the peeling-off of the second protection layer 38 can be prevented, and the high-quality second protection layer 38 can be formed since the hole 38b and the organic pattern 37 serve as a movement path of the outgas 70.

Figure 12:
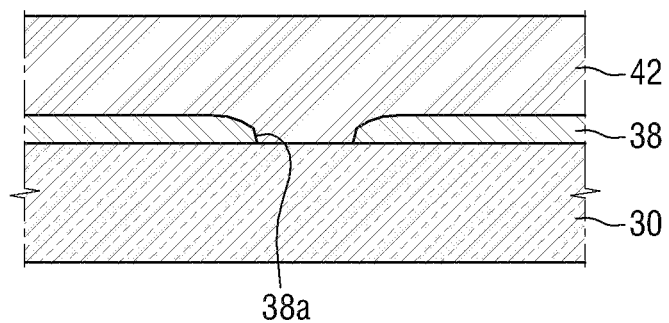
FIG. 12 is an enlarged cross-sectional view of a hole of a display device according to still another embodiment.

FIG. 12 is an enlarged cross-sectional view of a hole 38a of a display device according to still another embodiment. For convenience in explanation, the same reference numerals are used for elements which are substantially the same as the elements illustrated in FIG. 1, and the duplicate explanation thereof will be omitted.

Referring to FIG. 12, unlike some embodiments, the organic pattern 34 may not be present on the area where the hole 38a is formed. That is, instead of the organic pattern 34, an insulating film, that is, a part of the pixel-defining film 42 may come in direct contact with the hole 38a.

Hereinafter, a method for fabricating a display device according to still another embodiment will be described with reference to FIGS. 13 to 17. FIGS. 13 to 17 are cross-sectional views explaining a method for fabricating a display device according to still another embodiment. For convenience, the explanation of a portion that is duplicate to the contents of the above-described display device will be omitted.

Figure 13:
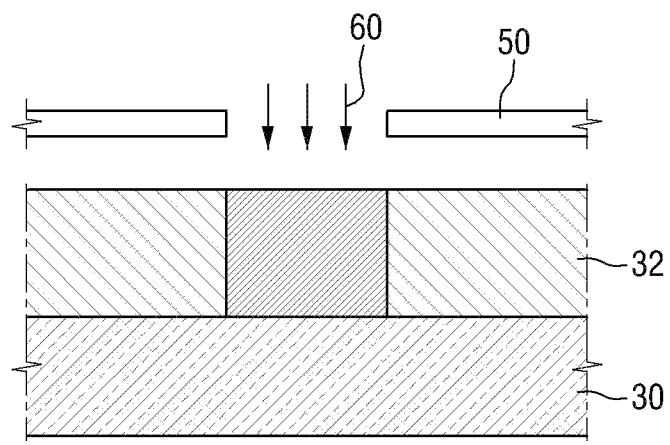
FIGS. 13 to 17 are cross-sectional views explaining a method for fabricating a display device according to still another embodiment.
Figure 14:
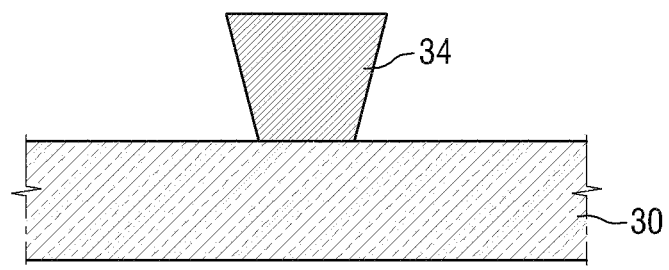
Figure 15:
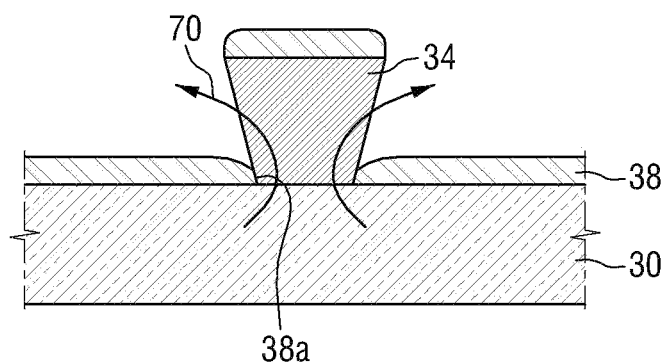

First, FIGS. 13 to 15 are drawings corresponding to FIGS. 4 to 6, respectively, and the explanation thereof will be omitted.

Figure 16:
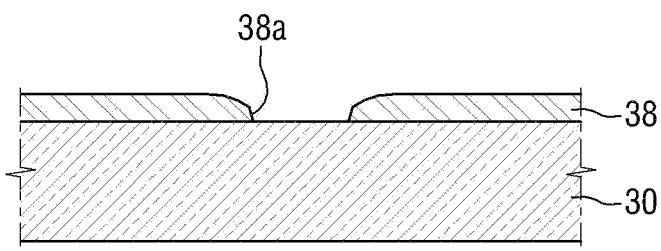

Next, referring to FIG. 16, the organic pattern 34 and the second protection layer 38 on the area where the hole 38a is formed may be removed using a stripper or the like. In an exemplary embodiment, the height of the organic pattern 34 may be three times higher than the height of the second protection layer 38, and the organic pattern 34 may cause a step height of the pixel-defining film 42 that is laminated on the organic pattern 34. Accordingly, before performing the subsequent process, that is, just after forming the second protection layer 38, the organic pattern 34 and the second protection layer 38 on the organic pattern 34 may be removed to remove the factor causing the step height of the pixel-defining film 42.

Figure 17:
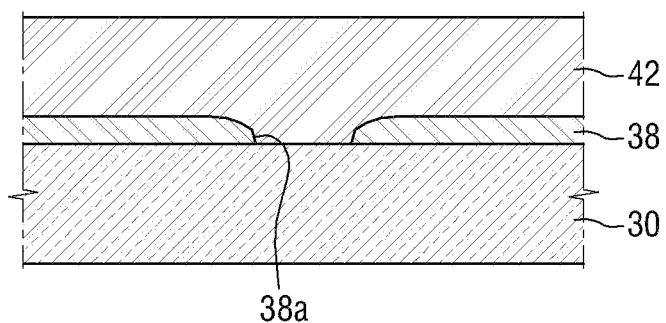

Next, referring to FIG. 17, the pixel-defining film 42 may be formed on the planarization layer 30 and the second protection layer 38. In some embodiments, a part of the pixel-defining film 42 may come in direct contact with the planarization layer 30.

Figure 18:
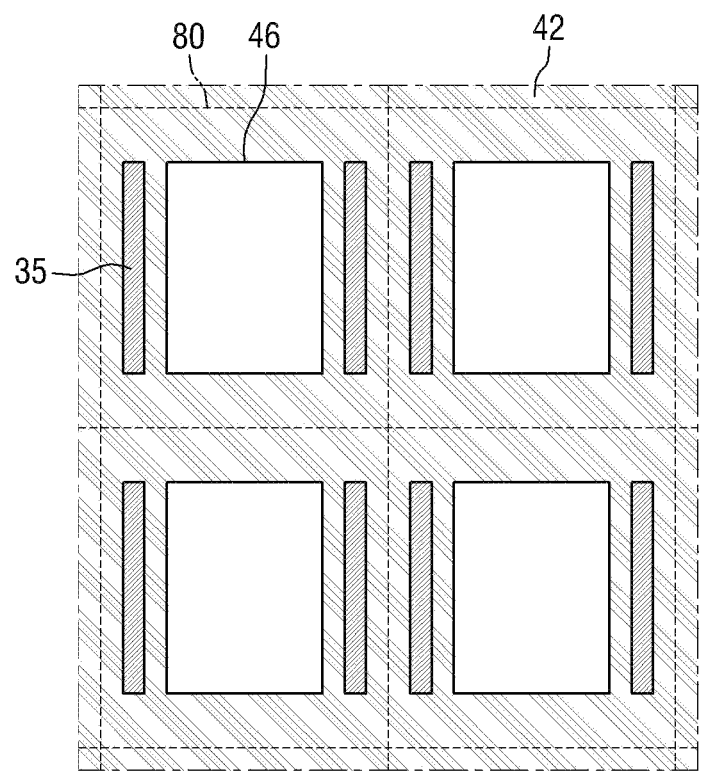
FIGS. 18 and 19 are plan views of a display device according to still another embodiment.
Figure 19:
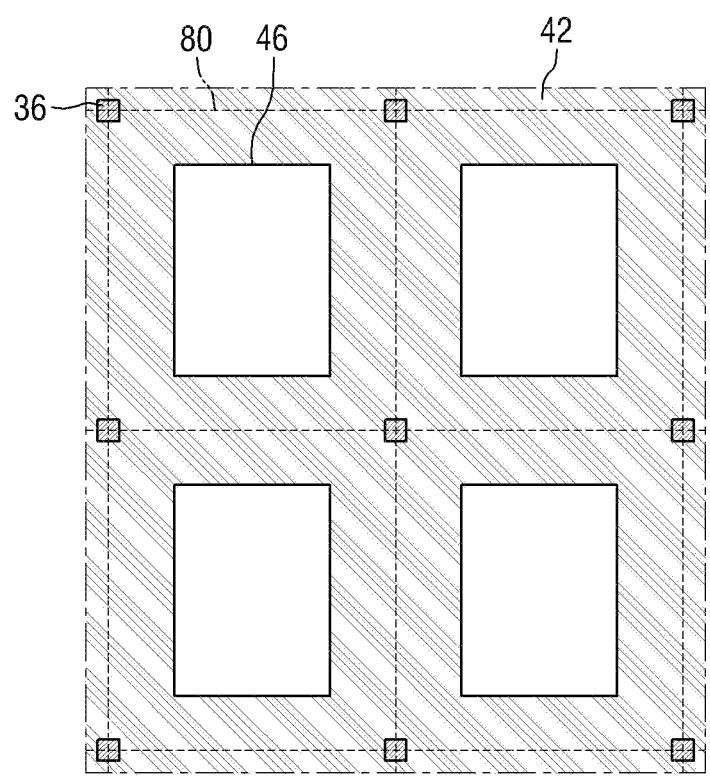

FIGS. 18 and 19 are plan views of a display device according to still another embodiment. For convenience, the same reference numerals are used for elements which are substantially the same as the elements illustrated in FIG. 3, and the duplicate explanation thereof will be omitted.

Referring to FIG. 18, an organic pattern 35 of the display device according to still another embodiment may be formed in a line form in an area that is adjacent to both side surfaces of the emission layer 46. Next, referring to FIG. 19, an organic pattern 36 may be formed in a portion where four unit pixel areas 80 meet together. In some embodiments, the organic pattern 36 may be formed on an area that corresponds to a corner portion of the emission layer 46.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims. It is therefore desired that the present embodiments be considered in all respects as illustrative and not restrictive, reference being made to the appended claims rather than the foregoing description to indicate the scope of the invention.

What is claimed is:

1. A display device comprising:
   a substrate;
   an organic film positioned on the substrate;
   an organic pattern positioned on at least a part of the organic film, the organic pattern comprising a bottom surface contacting the organic film, an upper surface facing the bottom surface and a side surface connecting the bottom surface to the upper surface;
   an inorganic film comprising a first portion positioned on the organic film, a second portion positioned to face at least a part of the side surface of the organic pattern, and a third portion positioned on the upper surface of the organic pattern;
   a first electrode positioned on the first portion of the inorganic film;
   a second electrode positioned on the first electrode; and
   an emission layer positioned between the first electrode and the second electrode to emit light by the first electrode and the second electrode,
   wherein a thickness of the second portion of the inorganic film is zero or smaller than a thickness of the third portion of the inorganic film.

2. The display device of claim 1, wherein the organic pattern is reverse-tapered.

3. The display device of claim 1, further comprising a pixel-defining film positioned on the inorganic film to partition an area in which the emission emitting layer is positioned.

4. The display device of claim 2, wherein the organic pattern is made of negative photoresist.

5. The display device of claim 1, wherein the organic pattern is substantially "T"-shaped.

6. The display device of claim 5, wherein the organic pattern is in contact with a part of the organic film that is exposed by the hole.

7. The display device of claim 5, wherein the inorganic film is not positioned on a side surface of at least a part of the organic pattern.

8. The display device of claim 7, further comprising
a pixel-defining film positioned on the inorganic film to partition an area in which the emission layer is positioned,
wherein the side surface of at least the part of the organic pattern is in contact with the pixel-defining film.

9. The display device of claim 1, wherein at least a part of the organic pattern is in direct contact with the organic film.

10. The display device of claim 1, wherein a plurality of emission layers are provided,
the plurality of emission layers are formed to be spaced apart from each other on substantially the same plane, and
the hole is positioned between the plurality of emission layers.

11. A display device comprising:
a substrate;
an organic film positioned on the substrate;
an inorganic film positioned on the organic film and having at least a hole for exposing at least a part of the organic film;
a first electrode positioned on the inorganic film;
a second electrode positioned on the first electrode;
an emission layer positioned between the first electrode and the second electrode to emit light by the first electrode and the second electrode;
an organic pattern positioned on the organic film that is exposed by the hole; and
a thin film transistor positioned between the substrate and the organic film to control a voltage that is applied to the first electrode and the second electrode,
wherein the hole is positioned to overlap the thin film transistor.

* * * * *